United States Patent [19]

Even-or

[11] Patent Number: 5,212,408
[45] Date of Patent: May 18, 1993

[54] ULTRA FAST PIN DIODE SWITCH

[75] Inventor: Baruch Even-or, Chalfont, Pa.

[73] Assignee: AEL Defense Corp., Lansdale, Pa.

[21] Appl. No.: 832,107

[22] Filed: Feb. 6, 1992

[51] Int. Cl.⁵ .............................................. H03K 17/74
[52] U.S. Cl. ................................. 307/256; 307/317.1; 333/262
[58] Field of Search ...................... 307/317.1, 570, 256, 307/259; 333/262, 103, 104

[56] References Cited

U.S. PATENT DOCUMENTS

| | | | |
|---|---|---|---|
| 3,600,608 | 8/1971 | Gilbert | 307/259 |
| 3,617,771 | 11/1971 | Lee | 307/259 |
| 4,249,150 | 2/1981 | Bickley et al. | 333/262 |
| 4,510,472 | 4/1985 | Bickley et al. | 333/262 |
| 4,673,831 | 6/1987 | Reppen | 307/317.1 |
| 4,712,020 | 12/1987 | Basile | 307/256 |
| 4,883,984 | 11/1989 | Kess | 307/256 |
| 5,087,833 | 2/1992 | Sugai | 307/317.1 |
| 5,115,215 | 5/1992 | Koontz | 333/262 |

FOREIGN PATENT DOCUMENTS 0566913 8/1960 Belgium ............ 307/317.1

OTHER PUBLICATIONS

"Broadbanding the Shunt PIN-diode SPDT Switch", by Waugh, Microwave J (USA) vol. 18, No. 2 p. 59, Feb. '75.

Primary Examiner—William L. Sikes
Assistant Examiner—Toan Tran
Attorney, Agent, or Firm—Seidel, Gonda, Lavorgna & Monaco

[57] ABSTRACT

An electronic switch for selectably switching a high frequency signal between an input and an output. The switch comprises a switching element comprising at least two PIN diodes connected in series-opposed configuration between said input and said output. The switching element has a low impedance when the diodes are forward biased and a substantially higher impedance when the diodes are reverse biased. A bias circuit is connected to the diodes for selectably applying a forward bias current to the diodes for forward-biasing said diodes and a reverse bias voltage to the diodes for reverse-biasing said diodes. A bias current return circuit provides a high-speed return path for the forward bias current from the diodes to a return when said diodes are forward biased. A switch associated with the bias circuit and a resistive load are provided for applying the forward bias current to the load when the reverse bias voltage is applied to the diodes.

7 Claims, 2 Drawing Sheets

ULTRA FAST PIN DIODE SWITCH

FIELD OF INVENTION

The present invention relates to a high speed, high power, solid-state RF switch. The switch of the present invention is particularly well-suited for, but by no means limited to, extremely fast switching of high power high frequency signals, as required for state-of-the-art frequency hopping communication and jamming systems.

BACKGROUND OF THE INVENTION

High frequency PIN diodes have been used for switching applications in the past. See, for example, U.S. Pat. Nos. 4,712,020 and 4,883,984. The former patent discloses an RF switch which employs a PIN diode as the switching element. A first bias circuit provides forward dc current through the diode to turn it on, to enable RF energy to be transmitted through the diode. A second bias circuit provides a reverse dc current through the diode to turn it off and prevent RF transmission through it. A control circuit selectably enables the bias circuits. The latter patent discloses a PIN diode switch with a series circuit comprising two oppositely-poled PIN diodes, with a control current supplied to the junction between the two diodes through the collector-emitter path of a junction transistor and through an inductor. The switch according to that patent operates without high reverse bias voltages.

Prior PIN diode switches suffer several limitations, some of which are inherent in the use of PIN diodes. High frequency PIN diodes require substantial forward bias current in order to reduce their ohmic losses at the low end of the frequency band. This bias current must be supplied to the PIN diodes via an RF blocking circuit in order to avoid RF leakage back into the bias and control circuitry. The low end of the frequency band is typically about 1 to 2 Mhz (corresponding to a time constant of about one microsecond), and since the RF blocking circuit must have a very high impedance (at least 1000 ohms), it is practically impossible to pass the required high bias current through it in less than 50 microseconds. Furthermore, attempting to speed up the bias current through the RF blocking circuit creates, in general, extreme voltage transients, since the RF blocking device is an inductor and the voltage across it is proportional to the change in current ($V = L\, di/dt$). These extreme voltage transients tend to "contaminate" the communication spectrum when using the switches in frequency hopping communication systems, and they also stress the electronic components.

RF blocking circuits for high power high frequency signals are difficult to build due to the extreme bandwidth requirements (i.e., 1 to 30 MHz, or a 30-to-1 bandwidth ratio). Moreover, when attempting to pass high dc currents through such blocking circuits, the ferrite material which is used inside these circuits saturates, causing sever heating and signal distortions. To compensate for saturation, the ferrite size has to be substantially increase, resulting in RF blocking circuits of substantial size and weight. High dc bias currents passing through the RF blocking circuit also suffer ohmic losses ($I^2R$ losses, where R is the ohmic resistance of the blocking circuit). This reduces the efficiency of the switch.

In addition, in order to turn off a high frequency PIN diode switch, a high reverse dc voltage is applied across the diode. The level of this dc voltage typically far exceeds the amplitude of the high frequency signal being switched. When attempting to rapidly turn off the PIN diode via the RF blocking circuit, extreme current will be generated, as required to clear the PIN diode of stored charges. This extreme current will cause the generation of substantial voltage transients, as already described.

There is therefore a need for a PIN diode switch that overcomes these drawbacks of prior PIN diode switches.

The present invention is such a switch. In the present invention, the RF blocking circuit passes only low level bias currents, minimizing ohmic losses, ferrite saturation and voltage transients. Moreover, the dc bias currents through the inductors in the blocking circuit are maintained at a constant level (i.e., $di/dt$ is zero). The bias currents are switched between the PIN diode switch element and a dummy load, allowing ultra high speed switching without voltage transients. At the same time, the dc current through the RF blocking circuit is always balanced. That is, a current component that is flowing in one direction is being counteracted by a current component with a similar magnitude flowing in the opposite direction. This arrangement prevents ferrite saturation and voltage transients. The RF blocking circuit acts as a transmission line both for the forward bias current and the high voltage turn-off signal, while at the same time blocking RF leakage from the switch element into the rest of the circuitry.

SUMMARY OF THE INVENTION

The present invention is an electronic switch for selectably switching a high frequency signal between an input and an output. The switch comprises a switching element comprising at least two PIN diodes connected in series-opposed configuration between said input and said output. The switching element has a low impedance when the diodes are forward biased and a substantially higher impedance when the diodes are reverse biased. A bias circuit means is connected to the diodes for selectably applying a forward bias current to the diodes for forward-biasing said diodes and a reverse bias voltage to the diodes for reverse-biasing said diodes. A bias current return means provides a high-speed return path for the forward bias current from the diodes to a return when said diodes are forward biased. Switch means associated with the bias circuit means and a resistive load are provided for applying the forward bias current to the load when the reverse bias voltage is applied to the diodes.

DESCRIPTION OF THE DRAWINGS

For the purpose of illustrating the invention, there is shown in the drawings a form which is presently preferred; it being understood, however, that this invention is not limited to the precise arrangements and instrumentalities shown.

FIG. 1 is a simplified schematic diagram of an electronic switch according to the invention, including related circuitry, and is divided for convenience into parts A and B.

DESCRIPTION OF THE INVENTION

Figure 1A:
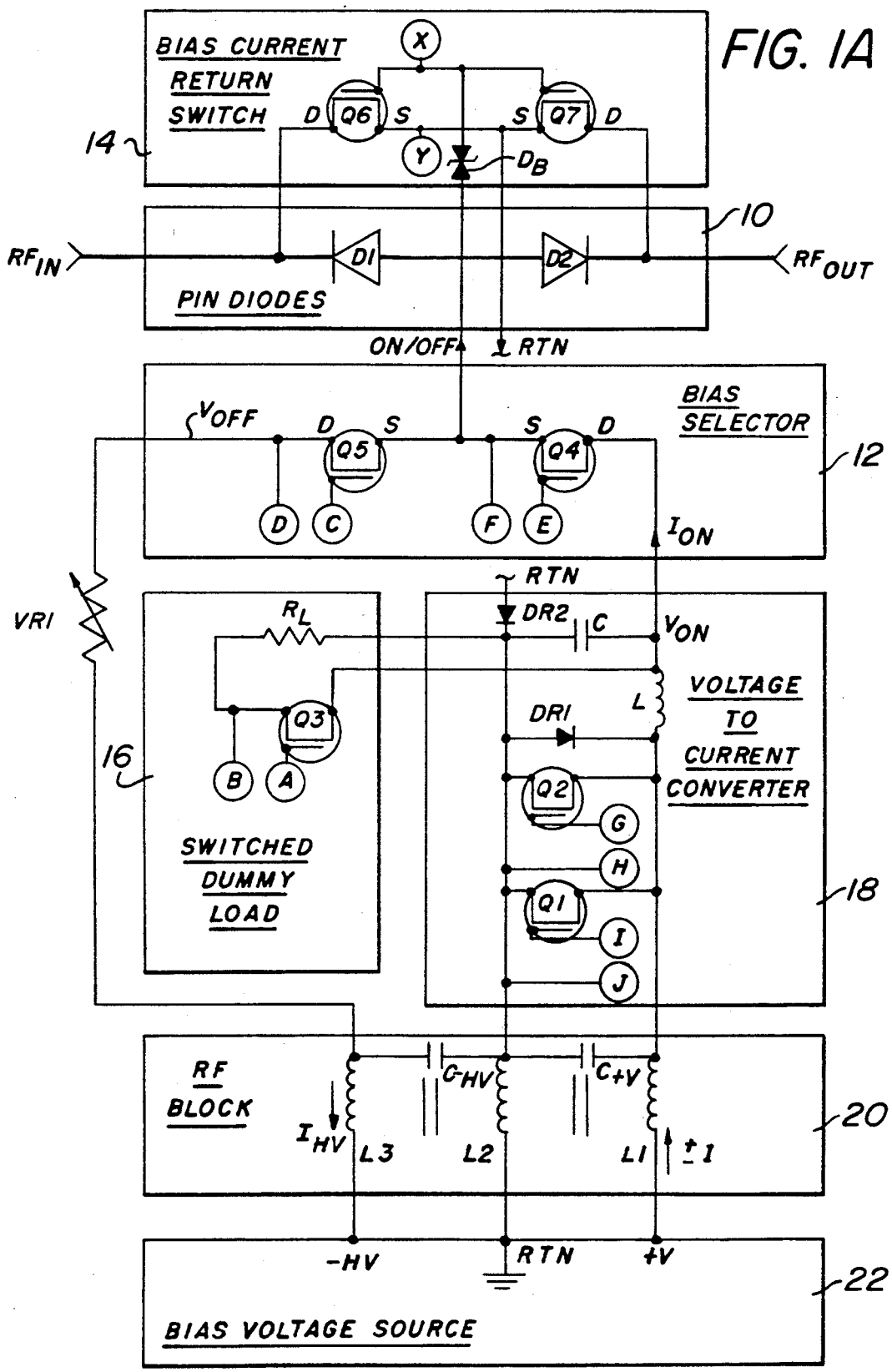
FIG. 1A illustrates the switch element, the bias selector, the bias current return switch, the dummy load and the parts of the circuit comprising the source of the bias currents.

Referring now to the drawings, there is shown in simplified schematic form a switch according to the present invention. In the preferred embodiment described and illustrated herein, the switch may be divided for purposes of description into eight separate sections as follows:

| | |
|---|---|
| 10 | switch element |
| 12 | bias selector |
| 14 | bias current return switch |
| 16 | dummy load |
| 18 | voltage-to-current converter |
| 20 | RF block |
| 22 | bias voltage source |
| 24 | switch control circuitry |

Of course, it will be understood that dividing the switch into the above-identified eight sections is solely for convenience in describing and understanding the invention, and does not in any way require the invention to be so divided in practice.

Switch element 10 comprises at least two PIN diodes D1 and D2 connected in series-opposed configuration between an RF signal input designated $RF_{IN}$ and an RF signal output designated $RF_{OUT}$. That is, the anodes of both diodes are connected together, while the cathode of D1 is connected to the RF signal input and the cathode of D2 is connected to the cathode of D2. Diodes D1 and D2 may be any suitable PIN diodes, depending on the bandwidth and power level of the RF signal to be switched. PIN diodes are known per se, and need not be described in detail here.

Bias currents to diodes D1 and D2 of switch element 10 are supplied via bias selector 12 and bias current return switch 14. Bias selector 12 comprises FET switches Q4 and Q5, along with their associated gate control circuitry to be described in greater detail below. Bias current return switch 14 comprises FET switches Q6 and Q7, along with their associated gate control circuitry to be described in more detail hereinafter. The selected ON/OFF bias from bias selector 12 to switch element 10 is applied to the anodes of PIN diodes D1 and D2. The ON/OFF bias is also applied to the gate terminals of FETs Q6 and Q7 in the bias current return switch 14 through a bidirectional breakdown diode $D_B$. As those skilled in the art will understand, a bidirectional breakdown diode is able to pass current in either direction once the voltage applied to the diode exceeds a predetermined level (the breakdown voltage). The drain terminals D of FETs Q6 and Q7 are connected to the cathodes of PIN diodes D1 and D2, respectively, to complete the current path for the ON/OFF bias currents. The source terminals of FETs Q6 and Q7 are both connected to ground return, designated RTN.

The ON bias current $I_{ON}$ is generated in voltage-to-current converter 18 from a positive voltage +V supplied by bias voltage source 22 through RF block 20. Voltage-to-current converter comprises FETs Q1 and Q2 and their associated gate control circuitry (to be explained in detail later), along with associated diodes DR1 and DR2, capacitor C and inductor L. Voltage +V may be derived from any convenient source. Then value of +V is preferably sufficient to yield a bias current $I_{ON}$ on the order of one ampere. However, those skilled in the art will be able to determine appropriate bias currents and supply voltages for a particular application, and it should be understood that the currents and voltages given herein are illustrative and do not limit the invention to any particular currents or voltages.

RF block 20 comprises a trifilar inductor having three insulated windings L1, L2 and L3 twisted together and wound on a single magnetic core, indicated schematically in FIG. 1A by two pairs of vertically-oriented parallel lines. One terminal of L1 is connected to +V, one terminal of L2 is connected to RTN, and one terminal of L3 is connected to a source of high negative voltage −HV. The other ends of L1 and L2 are bridged by a capacitor $C_{+V}$, and the other ends of L2 and L3 are bridged by a capacitor $C_{-HV}$. Winding L1 provides the current path for the current to voltage-to-current converter 18 from which $I_{ON}$ will be generated. Winding L3 provides the current path for the bias current $I_{HV}$, to be described below, which turns off switch element 10. Winding L2 provides a common return for windings L1 and L2. The trifilar arrangement prevents core saturation during the ON state of the switch element 10, allowing for the use of very small cores. It also permits high-speed switch turn off/turn on, since it acts as a transmission line.

The forward bias current $I_{ON}$ is also connected to a switched dummy load 16. Switched dummy load 16 comprises a resistive load $R_L$ in series with a FET switch Q3 and its associated gate control circuitry. Forward bias current $I_{ON}$ is diverted to resistive load $R_L$ when the switch element is off, as will be described in more detail hereinafter.

Figure 1B:
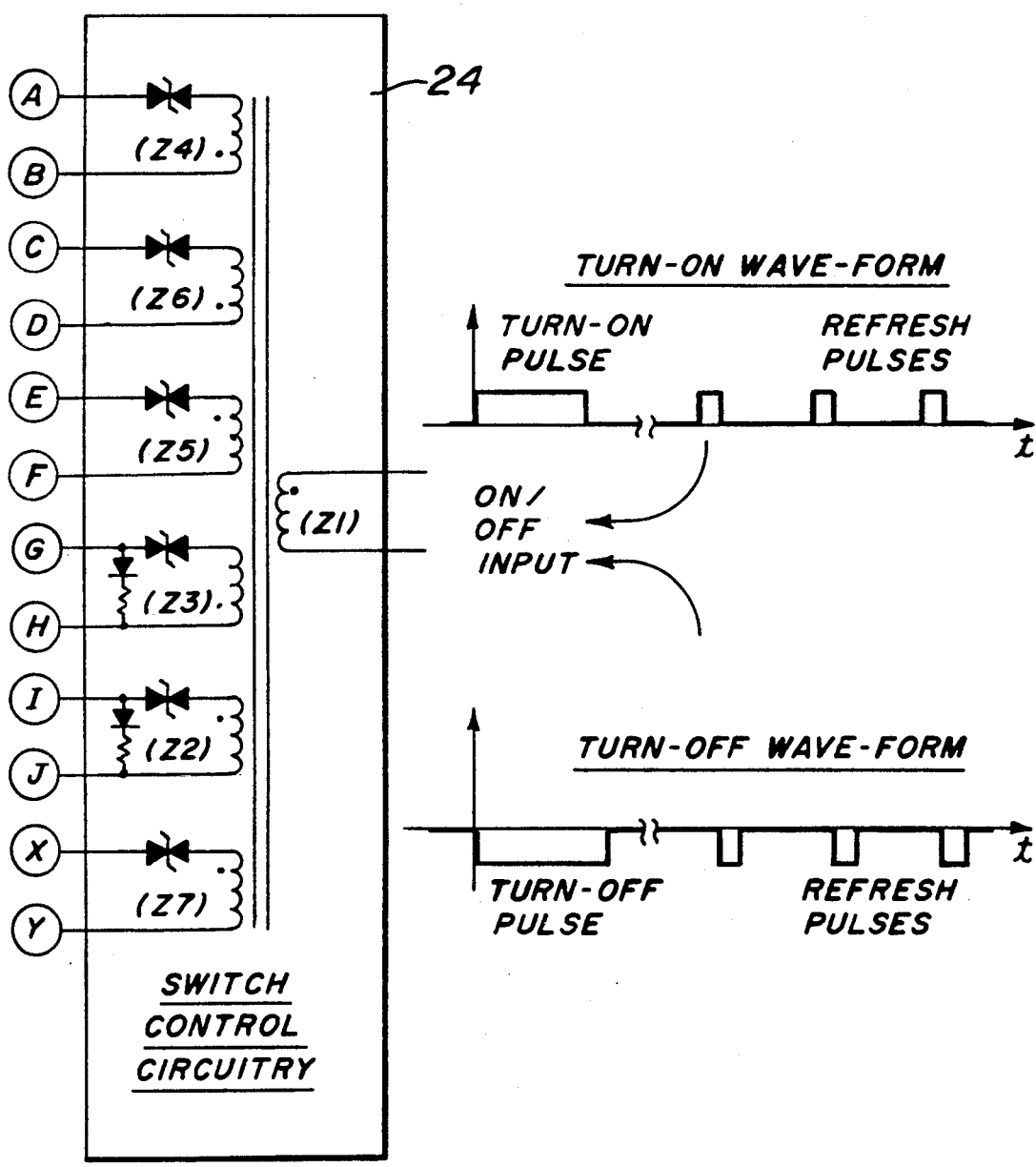
FIG. 1B illustrates circuitry for controlling the switch, along with exemplary control waveforms.

The switch control circuitry 24 for the FET switches Q1 through Q7 is illustrated in FIG. 1B. Switch control circuitry 24 comprises a seven-winding transformer having a single primary winding Z1 and six secondary windings Z2 through Z7. The switch control circuitry 24 transforms the input waveforms (the turn-on and turn-off waveforms, also illustrated in FIG. 1B) into the appropriate, isolated dc drive signals to the gates of FETs Q1 through Q7. Switch control circuitry 24 can be implemented in various other forms, as those skilled in the art will recognize. However, the circuitry must provide high voltage isolation, over the entire RF frequency range, between the input and the outputs. It must also pass high-speed turn-on and turn-off pulses while maintaining the voltage isolation. While the disclosed embodiment is a convenient way of implementing the switch control circuitry, it should be recognized that other implementations may be employed without departing from the invention. Likewise, the turn-on and turn-off pulses shown in FIG. 1B are illustrative only and may vary in shape. Only one possible waveform is shown, and it should be understood that the invention is not limited to any particular shape of turn-on and turn-off pulses. In the illustrated waveforms, each consists of a turn-on or turn-off pulse followed by a sequence of refresh pulses. The turn-on and turn-off pulses provide sufficient current in order to rapidly charge (either positively or negatively) the gates of all the FETs. The refresh pulses provide sufficient current after turn-on or turn-off to the FET gates to compensate for the normal gate discharge (due to leakage) over time.

Operation of the switch will now be described with reference to the Figures and to the foregoing description of the various parts of the switch.

The PIN diodes D1 and D2 in switch element 10 can either pass RF energy from $RF_{IN}$ to $RF_{OUT}$ or block the RF. When passing RF, i.e., when in the "on" state, diodes D1 and D2 exhibit low RF impedance (typically 0.2 or fewer ohms). This low impedance is primarily due to a phenomenon known as charge storage in diodes. The diode's junction is saturated with so-called "minority carriers," which are electrical charges. These electrical charges are supplied by the forward bias current and carry the RF from the input to the output. When blocking RF, i.e., when in the "off" state, diodes D1 and D2 exhibit high RF impedance (typically 500 or more ohms). This high impedance is obtained by reverse-biasing diode's junction capacitance (reduced capacitance the diodes. This results in a reduction of the corresponds to increased impedance), as well as an increase in its ohmic resistance. (This is well-known from the theory of reverse-biased PN junction diodes; the PIN diode in reverse bias is similar to a conventional PN diode in reverse bias.) Reverse-biasing the PIN diodes is accomplished by applying a high negative voltage to the anodes of diodes D1 and D2.

The switch is always fed by either the turn-on or turn-off waveform and by both voltages $+V$ and $-HV$. The $+V$ and $-HV$ voltages and their return path RTN are fed via the trifilar blocking inductor of RF block 20 and are stored across capacitors $C_{+V}$ and $C_{-HV}$. This arrangement allows dc power transfer from the external potentials into the switch while maintaining full RF isolation by the trifilar inductor. The trifilar inductor appears as a transmission line with low impedance to the $+V$ and $-HV$ voltages, which means that there are no voltage transients, or "spikes." In addition, currents I and $I_{HV}$ are always flowing through RF block 20 in both directions, and thus the magnetic core of the trifilar inductor will see a balanced current flow and will not saturate. This also permits the $-HV$ voltage to be instantly applied to the PIN diodes D1 and D2, via FET Q5, without causing voltage spikes.

The current I flowing to voltage-to-current converter 18 through inductor winding L1 provides the forward bias current $I_{ON}$ which forward biases PIN diodes D1 and D2 and renders the switch element 10 conductive, or "on." Voltage-to-current converter 18 converts a high voltage $+V$ and a low current I to a high current $I_{ON}$ and a low voltage $V_{ON}$. FET Q1 acts as a voltage chopper with respect to $+V$ and is turned on by the turn-on pulse and periodically turned on thereafter by the refresh pulses. Inductor L and capacitor C form an LC filter and, together with the rectifying diode DR1, converts the chopped $+V$ voltage into a dc current $I_{ON}$.

The turn-on pulses also turn on FET Q4, which allows the bias current $I_{ON}$ to flow to the anodes of PIN diodes D1 and D2, forward biasing them and rendering switch element 10 conductive. The bias current $I_{ON}$ is returned via FETs Q6 and Q7 of bias current return switch. FETs Q6 and Q7 are also turned on by the turn-on pulses, and provide a high-speed return path from the cathodes of D1 and D2, respectively, to the RTN line. This maintains constant dc current flow in the voltage-to-current converter, increases response time, prevents voltage transients during the switch on-off-on transitions, prevents saturation of the magnetic core in the RF block.

At the same time, the turn-on pulses turn off FETs Q2, Q3 and Q5. Hence, dummy load 16 is switched out of the circuit, and no bias current $I_{ON}$ flows through it. Likewise, substantially no current flows through Q5.

When a turn-off pulse is received, FETs Q1, Q4, Q6 and Q7 are turned off, and FETs Q2, Q3 and Q5 turned on. FET Q2 now acts as a voltage chopper with respect to $+V$, in a manner similar to the operation of Q1 during turn-on. The diode DR1 and the LC filter comprising inductor L and capacitor C converts the chopped $+V$ voltage into a dc current $I_{OFF}$. Since Q4 is off and Q3 is on, current $I_{OFF}$ flows through inductor L, FET Q3 and resistive load Rr, and from there to the RTN line. This ensures constant dc current flow through windings L1 and L2 of RF block 20, so that there are no voltage spikes introduced by stopping the flow of current through RF block 20 and voltage-to-current converter 18.

At the same time, FET Q4, being turned off, prevents current flow from voltage-to-current converter 18 to PIN diodes D1 and D2. In addition, FET Q5, being turned on, connects the high negative voltage $-HV$ to the PIN diodes D1 and D2 and to the gates of FETs Q6 and Q7 in bias current return switch 14. The high negative voltage $-HV$ reverse-biases the PIN diodes, and consequently converts them from low resistance devices into high impedance devices as required to render switching element 10 non-conductive, or "off." FETs Q6 and Q7 are maintained off by $-HV$, opening the bias current return path that previously existed through those devices. Instead, the $-HV$ return path is through high-voltage diode $DR_2$ and winding L2 of the trifilar inductor in RF block 20. If desired, a variable resistor $VR_1$ may be inserted in series between Q5 and winding L3 of the trifilar inductor to control the transition time from the switch "on" state to the switch "off" state.

The present invention may be embodied in other specific forms without departing from the spirit or essential attributes thereof and, accordingly, reference should be made to the appended claims, rather than to the foregoing specification, as indicating the scope of the invention.

I claim:

1. An electronic switch for selectably switching a high frequency signal between an input and an output, comprising
   (a) a switching element comprising at least two PIN diodes connected in series-opposed configuration between said input and said output, said switching element having a low impedance when said diodes are forward biased and a substantially higher impedance when said diodes are reverse biased,
   (b) bias circuit means connected to said diodes for selectably applying a forward bias current to the diodes for forward-biasing said diodes and a reverse bias voltage to the diodes for reverse-biasing said diodes,
   (c) bias current return means connected to said diodes for providing a high-speed return path for the forward bias current from said diodes to a return when said diodes are forward biased,
   (d) switch means connected between said bias circuit means and a resistive load for applying the forward bias current to said load when the reverse bias voltage is applied to the diodes,
   (e) bias voltage source means connected to said bias circuit means for supplying a positive voltage and a negative voltage thereto, and
   (f) RF blocking circuit means comprising a trifilar high frequency inductor connected between said bias voltage source means and said bias circuit means.

2. An electronic switch according to claim 1, wherein said bias circuit means comprises circuit means for converting said positive voltage from said bias voltage source means to said forward bias current and switch means for selectably applying said forward bias current to said diodes.

3. An electronic switch for selectably a high frequency signal between an input and an output, comprising (a) a switching element comprising at least two PIN diodes connected in series-opposed configuration between said input and said output, said switching element having a low impedance when said diodes are forward biased and a substantially higher impedance when said diodes are reverse biased, (b) bias voltage source means for supplying a positive voltage and a negative voltage, (c) bias circuit means having at least one input connected to said bias voltage source means and at least one output connected to said diodes for selectably applying a forward bias current to the diodes for forward-biasing said diodes and a reverse bias voltage to the diodes for reverse-biasing said diodes, said bias circuit means including means for converting said positive voltage from said bias source means to said forward bias current and switch means for selectably applying said forward bias current to said diodes, (d) blocking circuit means connected between said bias voltage source and said bias circuit means for preventing propagation of said high frequency signal from said switching element to said bias voltage source, said blocking circuit means including a trifilar high frequency blocking inductor, (e) bias current return means connected to said diodes for providing a high-speed return path for the forward bias current from said diodes to a return when said diodes are forward biased, and (f) switch means connected between said bias circuit means and a resistive load for applying the forward bias current to said load when the reverse bias voltage is applied to the diodes.

4. An electronic switch according to claim 3, further comprising switch control means connected to said diodes for controlling the bias state of the diodes in response to switch control input signals.

5. An electronic switch according to claim 4, wherein the switch control input signals comprise at least two asymmetrical waveforms for respectively turning the switch on and off.

6. An electronic switch according to claim 5, further comprising a turn-on pulse for causing said switch to rapidly assume the on state.

7. An electronic switch according to claim 5, said switch control means including a pair of Zener diodes for converting said asymmetrical waveforms into dc voltages.

* * * * *

UNITED STATES PATENT AND TRADEMARK OFFICE
CERTIFICATE OF CORRECTION

PATENT NO. : 5,212,408  
DATED : May 18, 1993  
INVENTOR(S) : Baruch Even-Or

Page 1 of 2

It is certified that error appears in the above-indentified patent and that said Letters Patent is hereby corrected as shown below:

The title page showing the illustrative-figure should be deleted to be replaced with the attached title page.

Sheet 1 of the drawings, consisting of Fig. 1A, should be deleted to be replaced with the sheet of drawing, consisting of Fig. 1A as shown on the attached page.

Signed and Sealed this

Third Day of May, 1994

*Attest:*

BRUCE LEHMAN

*Attesting Officer*     *Commissioner of Patents and Trademarks*

United States Patent [19]

Even-or

[11] Patent Number: 5,212,408
[45] Date of Patent: May 18, 1993

[54] ULTRA FAST PIN DIODE SWITCH

[75] Inventor: Baruch Even-or, Chalfont, Pa.

[73] Assignee: AEL Defense Corp., Lansdale, Pa.

[21] Appl. No.: 832,107

[22] Filed: Feb. 6, 1992

[51] Int. Cl.$^5$ .................................... H03K 17/74
[52] U.S. Cl. ............................ 307/256; 307/317.1; 333/262
[58] Field of Search .............. 307/317.1, 570, 256, 307/259; 333/262, 103, 104

[56] References Cited

U.S. PATENT DOCUMENTS

| | | | |
|---|---|---|---|
| 3,600,608 | 8/1971 | Gilbert | 307/259 |
| 3,617,771 | 11/1971 | Lee | 307/259 |
| 4,249,150 | 2/1981 | Bickley et al. | 333/262 |
| 4,510,472 | 4/1985 | Bickley et al. | 333/262 |
| 4,673,831 | 6/1987 | Reppen | 307/317.1 |
| 4,712,020 | 12/1987 | Basile | 307/256 |
| 4,883,984 | 11/1989 | Kess | 307/256 |
| 5,087,833 | 2/1992 | Sugai | 307/317.1 |
| 5,115,215 | 5/1992 | Koontz | 333/262 |

FOREIGN PATENT DOCUMENTS 0566913  8/1960  Belgium ................. 307/317.1

OTHER PUBLICATIONS

"Broadbanding the Shunt PIN-diode SPDT Switch", by Waugh, Microwave J (USA) vol. 18, No. 2 p. 59, Feb. '75.

Primary Examiner—William L. Sikes
Assistant Examiner—Toan Tran
Attorney, Agent, or Firm—Seidel, Gonda, Lavorgna & Monaco

[57] ABSTRACT

An electronic switch for selectably switching a high frequency signal between an input and an output. The switch comprises a switching element comprising at least two PIN diodes connected in series-opposed configuration between said input and said output. The switching element has a low impedance when the diodes are forward biased and a substantially higher impedance when the diodes are reverse biased. A bias circuit is connected to the diodes for selectably applying a forward bias current to the diodes for forward-biasing said diodes and a reverse bias voltage to the diodes for reverse-biasing said diodes. A bias current return circuit provides a high-speed return path for the forward bias current from the diodes to a return when said diodes are forward biased. A switch associated with the bias circuit and a resistive load are provided for applying the forward bias current to the load when the reverse bias voltage is applied to the diodes.

7 Claims, 2 Drawing Sheets

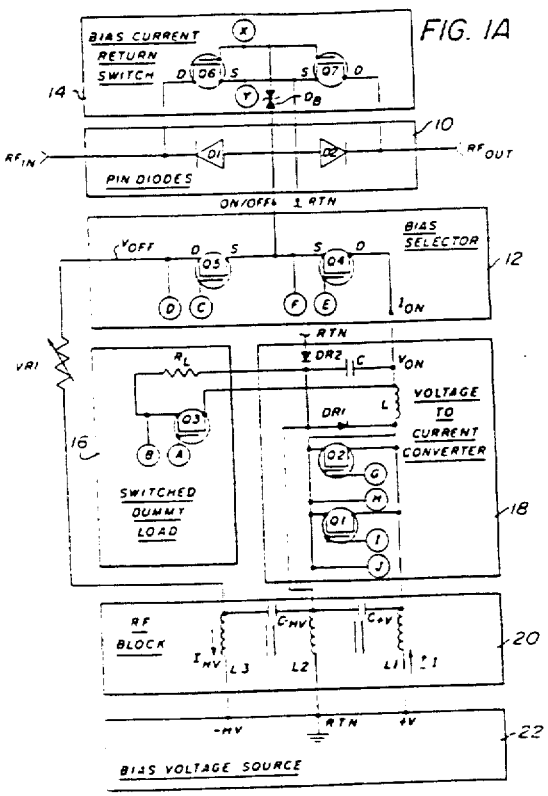

FIG. 1A